United States Patent
Kranitzky

[11] Patent Number: 5,216,626
[45] Date of Patent: Jun. 1, 1993

[54] POSITION MEASURING APPARATUS AND METHOD HAVING REDUCED MEMORY REQUIREMENTS

[75] Inventor: Walter Kranitzky, Traunstein, Fed. Rep. of Germany

[73] Assignee: Dr. Johannes Heidenhain GmbH, Fed. Rep. of Germany

[21] Appl. No.: 556,018

[22] Filed: Jul. 20, 1990

[30] Foreign Application Priority Data

Jul. 21, 1989 [EP] European Pat. Off. ........ 89113404.1

[51] Int. Cl.$^5$ ............... G06F 15/353; G06F 12/10; G01B 21/02
[52] U.S. Cl. ................... 364/561; 364/577; 364/723; 364/DIG. 1; 395/425
[58] Field of Search .............. 364/577, 723, 474.31, 364/255.1, 256.3, 602, 561, 562; 250/231.16, 231.13, 231.14; 395/425

[56] References Cited

U.S. PATENT DOCUMENTS

| | | | |
|---|---|---|---|
| 3,618,073 | 11/1971 | Domchick et al. | 340/347 SY |
| 4,468,747 | 8/1984 | Leavitt et al. | 364/577 |
| 4,471,449 | 9/1984 | Leavitt et al. | 364/577 |
| 4,697,125 | 9/1987 | Goff et al. | 318/254 |
| 4,811,206 | 3/1989 | Johnson | 364/200 |
| 4,879,671 | 11/1989 | Rieder et al. | 364/562 |
| 4,901,258 | 2/1990 | Akiyama | 364/577 |
| 4,922,415 | 5/1990 | Hemdal | 364/200 |
| 5,041,829 | 8/1991 | Garrett | 341/13 |

FOREIGN PATENT DOCUMENTS

| | | |
|---|---|---|
| 0172803 | 6/1985 | European Pat. Off. . |
| 213904 | 11/1987 | European Pat. Off. . |
| 328683 | 8/1989 | European Pat. Off. . |
| 407569 | 12/1963 | Switzerland . |
| 2179515 | 8/1985 | United Kingdom . |
| 8901607 | 2/1989 | World Int. Prop. O. . |

*Primary Examiner*—Kevin J. Teska
*Assistant Examiner*—Collin W. Park

[57] ABSTRACT

In a position measuring system, periodic scanning signals are obtained by scanning a measurement embodiment. These scanning signals are interpolated with greater precision with the aid of a subdivision circuit. Interpolation values are deposited in a memory unit in individual addressable storage units. The present invention reduces the required memory space to one eighth of its original size. In addition, the geometric arrangement of the memory unit is altered making the position measuring system adaptable to VLSI technology.

9 Claims, 3 Drawing Sheets

1

POSITION MEASURING APPARATUS AND METHOD HAVING REDUCED MEMORY REQUIREMENTS

BACKGROUND OF THE INVENTION

1. Field of the Invention

The present invention is generally directed to a method and apparatus for reducing the memory required by position measuring systems, and more particularly, an arrangement for reducing the amount of memory required to store interpolation values for position encoders thus making the measurement system adaptable to VLSI technology.

2. Description of the Prior Art

Incremental measuring systems are generally well known in the art. The linear displacement or angular rotation of an element is determined by detecting pulses. Typically, these pulses are summed up in an electronic up-down counter and the measurement value is numerically displayed.

FIG. 1 illustrates an incremental rotational position measuring system. The measurement embodiment comprises a graduated plate 2 with a radial grid 3 thereon connected to a shaft 5. There is also a reference mark 4 on the graduated plate 2. In order to detect the position of the shaft 5, the radial grid 3 is scanned by a scanning unit, the essential components of which are a light source 6, a condenser lens 7, a scanning plate 8 and at least two photodetectors 9.

In operation, as the graduated plate 2 turns, the gaps in the scanning plate 8 and the radial grid 3 periodically align so that a beam of light from the light source 6 impinges upon the photodetectors 9 in accordance with the transmission pattern on the grid 3. The photodetectors 9 thus receive a periodically changing amount of light which is transformed into electrical signals. The two photodetectors 9 are offset from one another by one fourth the graduation period, T/4. This offset creates signals U1 and U2 which are 90° out of phase with each other.

In an evaluating circuit EXE, signals U1 and U2 are digitalized by an A/D converter and interpolated. The interpolation values are determined in advance and are stored in memory which will be further discussed with respect to the present invention. Interpolation increases measurement precision. The output of the evaluating circuit EXE comprises the digitalized and interpolated signals in the form of countable square pulses.

In the simple device illustrated in FIG. 1, the two analog signals have a combination of four (4) zero crossings during one graduation period T. The resolution of the position measuring system is therefore only one-fourth ($\frac{1}{4}$) of the graduation period. Obviously, to obtain precise measurements, a higher resolution is required and thus the graduation period must be further subdivided.

In Swiss patent CH-PS 4 07 569 a method of increasing the resolution of an interpolating position measuring system is disclosed. The amplitudes of the two signals U1 and U2 are chosen such that $$U1 = A1\ \sin(2\pi X/T)$$

$$U2 = A2\ \cos(2\pi X/T)$$

where,

X is the path or angle

T is the signal period so that $A1 = \cos \rho$ and $A2 = \sin \rho$. The two signals U1 and U2 are then added yielding $U = \sin(\rho + 2\pi X/T)$.

Signal U is thus phase displaced to signal U1 by $\rho$. Signals can be generated which are phase displaced up to 25 times thus achieving a resolution of up to 1/100 of the scale graduation period.

In order, however, to provide an interpolating position measuring device with such a high resolution, the circuitry becomes more complicated and expensive since for each phase displaced signal, a switching component is needed. This in turn requires that the number of comparators equal twice the subdivision factor.

In European Patent publication EP-A2-0,213,904 an improvement is provided by depositing the interpolation values in the form of an arctangent table in memory. The memory addresses are driven by a code which is formed by the two scanning signals phase displaced to one another. In addition, the publication also discloses that the memory requirement can be reduced to one quadrant of a cycle.

U.S. Pat. No. 4,697,125 discloses that if the analog signals are out-of-phase and sinusoidal, then the interpolation values must be arranged according to an arctangent function to ensure that the output pulses will properly reflect the rotational motion of a point on the plate.

Accordingly, it is a primary object of the present invention to provide a position measuring system that reduces the memory required to store interpolation values thus allowing the system to be implemented with very large scale integration (VLSI) technology.

Another object of the present invention is to provide reduced memory position measuring system that provides signal amplitude information and thus indicates erroneous signals.

Further objects and advantages will become apparent from the following description and the accompanying drawings.

SUMMARY OF THE INVENTION

The present invention is directed to a position measuring apparatus and method having reduced memory requirements.

The position of an object moving in a periodic path is determined by detecting the movement of the object and creating periodic analog signals in response to the object's movement. A subdivision circuit having a memory with addressable storage locations stores interpolation data. The memory has a first address range. The first address range is manipulated to transform those addresses to addresses in a second address range wherein the second address range is of expanded scope from the first address range. The second address range has sufficient addresses to store interpolation data for signal period for the periodic signals range.

The present invention has a significant advantage in that the memory required for a position measuring system is reduced thus making the system adaptable to VLSI technology.

Further advantages will become apparent from the detailed description and the accompanying drawings.

BRIEF DESCRIPTION OF THE DRAWINGS

Further objects and advantages of this invention will become apparent and readily appreciated from the following detailed description of the present invention, taken in conjunction with the accompanying drawings, of which.

DETAILED DESCRIPTION OF THE PRESENTLY PREFERRED EMBODIMENTS

The preferred embodiments of the present invention will hereinafter be described in detail with reference to the accompanying drawings.

In accordance with the present invention, an incremental rotational position measuring system is described. The present invention, however, is not limited to rotational measuring systems but as will be recognized by those skilled in the art, the invention may be used in linear measuring systems.

The present drawings illustrate memory Z as having 256 storage units in order to adequately describe the present invention. In the preferred embodiment, the present invention uses a memory one-eighth ($\frac{1}{8}$) the size of the memory Z shown in FIGS. 2 and 3. Thus, in this preferred embodiment, the required memory space to practice the present invention is 32 storage units.

Figure 1:
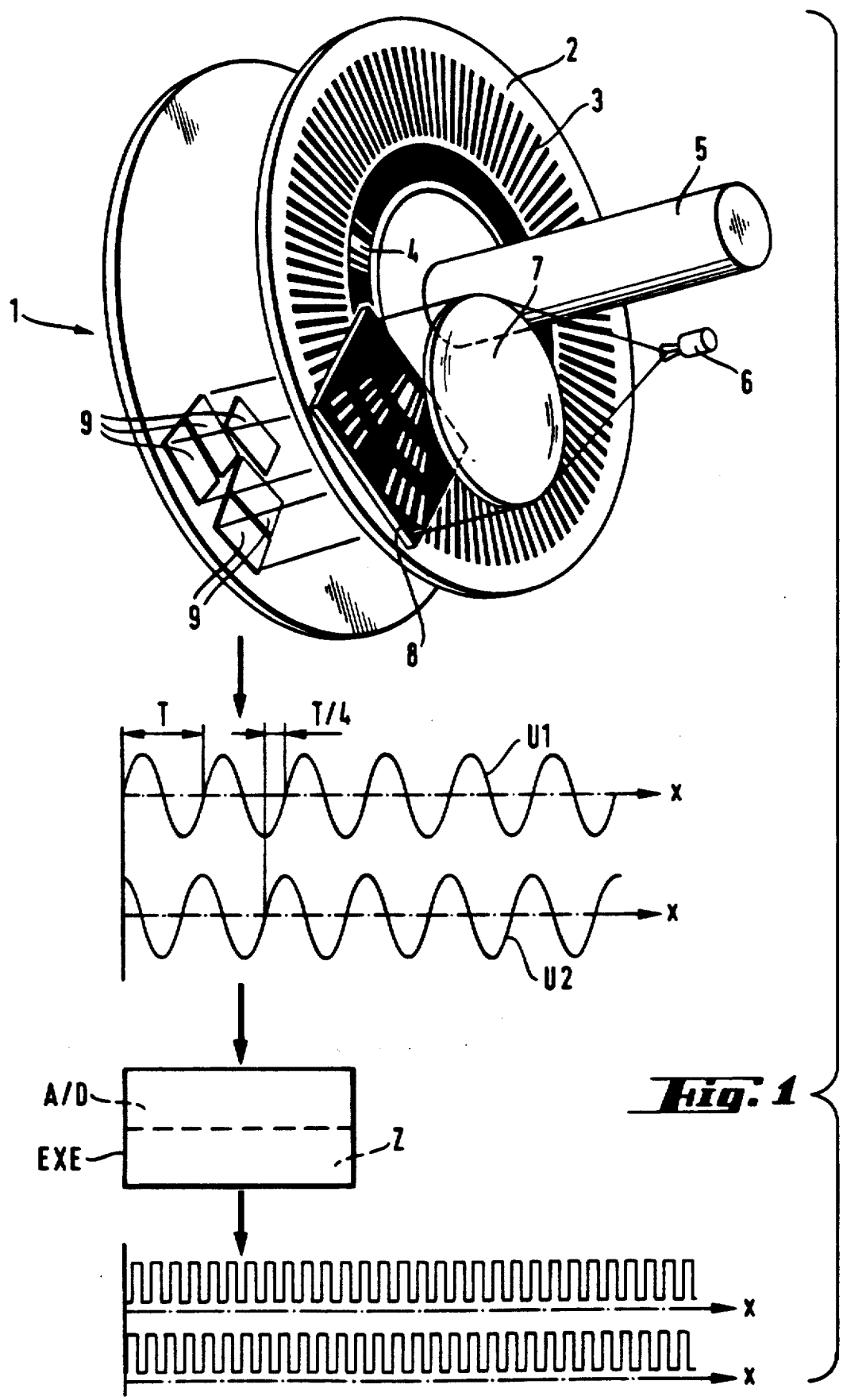
FIG. 1 illustrates a typical position measuring system.

The position of an object moving in a periodic path is determined by detecting the movement of the object and creating periodic analog signals in response to the object's movement. As was described above, FIG. 1 illustrates a typical position measuring system wherein two electrical signals U1 and U2, which are out-of-phase with each other, are applied to an Analogue to Digital (A/D) converter. The output of the A/D converter is used to address a memory Z. Memory Z can be any suitable type of memory such as a programmable read only memory (PROM), an erasable PROM (EPROM). As the shaft 5 turns, the digitalization of signals U1 and U2 creates a unique binary code which determines an address in memory Z. Thus the contents located at that particular address can be read out of memory Z. The information stored at each address within memory Z preferably comprises data words which are the result of interpolation between the two signals U1 and U2 so as to determine the angular rotation of the shaft 5. Specifically, the data words in the storage units are coded words which are dependent upon the arc-tangent relation of signals U1 and U2 as well as the subdivision factor. These values are pre-calculated and pre-stored within memory Z.

Figure 2:
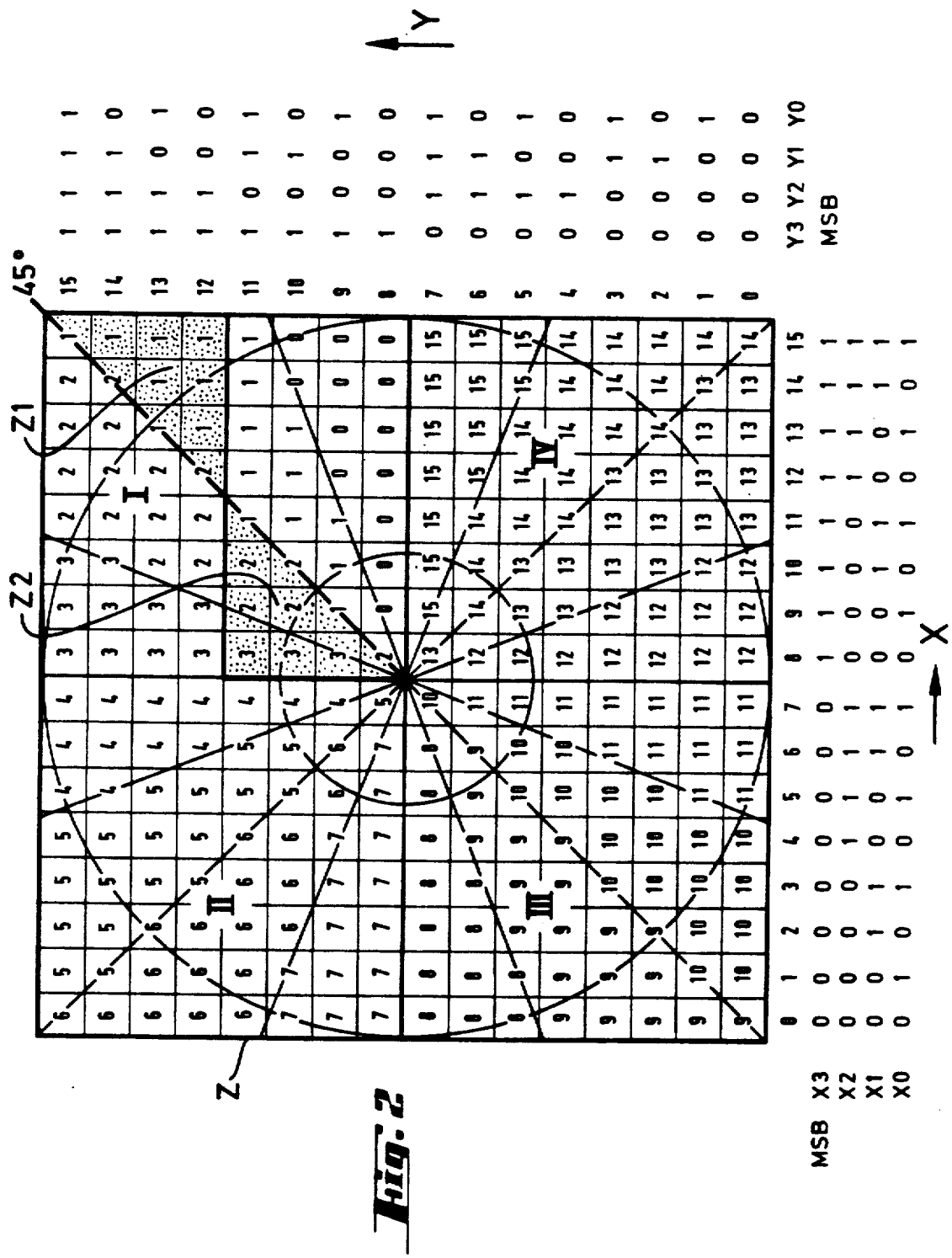
FIG. 2 illustrates a method of reducing memory space in accordance with the present invention from a conventional memory.
Figure 3:
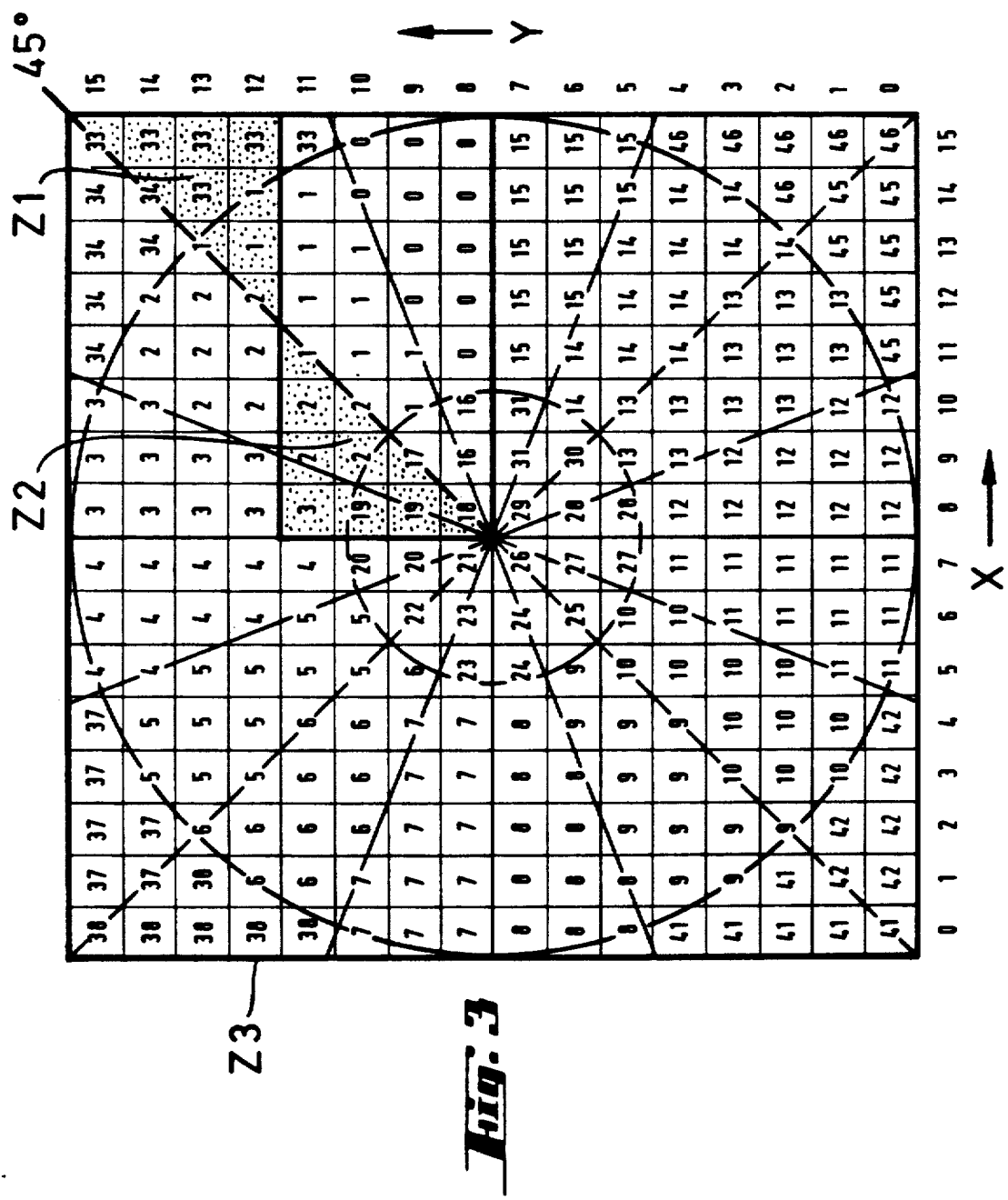
FIG. 3 is a memory divided into three zones providing signal amplitude information in accordance with the present invention.

FIG. 2 illustrates a memory Z having 256 data storage units. As stated above, the present invention reduces the memory requirement so that in reality only a memory one eighth the size of the memory illustrated in FIGS. 2 and 3 is required. As will be apparent to those skilled in the art, the present invention need not be practiced exclusively on a memory having 256 storage units but can be practiced on varying sizes of memory. The memory Z therefore has a number of storage spaces which represent the decimal value range of 0 to 15 in the coordinate addresses X and Y. Thus the graduation period is subdivided into 16 segments. The 256 storage units contain 256 data words which are necessary for a full interpolation of a graduation period T over 360° of rotation.

It becomes clear from the illustration of the memory Z that the data contained therein has a symmetrical and cyclical nature wherein the data words vary by additive constants. The present invention takes advantage of this symmetrical and cyclical nature to reduce the memory to one eighth its original size, i.e. 32 storage units. From these 32 storage units, the original entire memory Z containing 256 data words can be represented. The present invention, therefore, allows implementation of a position measuring system with VLSI technology.

FIG. 2 illustrates the memory Z subdivided into sixteen (16) segments having four (4) major quadrants, Quadrants I-IV. In order to reduce the memory size, the first step is to transform or "reflect" Quadrants II, III and IV into Quadrant I. This will reduce the required memory space to one-fourth ($\frac{1}{4}$) its original size. In order to reflect Quadrants II, III and IV into Quadrant I, the address and data stored in those Quadrants are manipulated in accordance with Table A. Of course, all of the transformations recited herein may be carried out by a computer.

TABLE A

| x3 | y3 | Quadrant | $X2^1 : X0^1$ | $Y2^1 : Y0^1$ | d |
|---|---|---|---|---|---|
| 1 | 1 | I | X2:X0 | Y2:Y0 | $d^1$ |
| 0 | 1 | II | $\overline{X2:X0}$ | Y2:Y0 | $7 - d^1$ |
| 0 | 0 | III | $\overline{X2:X0}$ | $\overline{Y2:Y0}$ | $8 + d^1$ |
| 1 | 0 | IV | X2:X0 | $\overline{Y2:Y0}$ | $15 - d^1$ | where:
X3 and Y3 represent the most significant bit (MSG) of the address coordinate.
X2 and Y2, X1 and Y1, X0 and Y0 represent the lower-valued bits in decreasing sequence down to the least significant bit (LSB)
X3:X0 represents the original X address (X3 X2 X1 X0)
Y3:Y0 represents the original Y address (Y3 Y2 Y1 Y0)
d represents the original storage content
$X2^1 : X0^1$ represents the transformed X-address
$Y2^1 : Y0^1$ represents the transformed Y-address
$d^1$ represents the transformed storage content.

The following example will help explain the operation of the quadrant transformation conducted in conformance with Table A. For example, suppose plate 2 is detected at an address where X=4 and Y=7. The binary representation of this address is X=0100 and Y=0111 wherein X3=0, X2=1, X1=0, X0=0 and Y3=0, Y2=1, Y1=1, Y0=1. The MSB of the X and Y address determine the quadrant of memory Z. The MSB of the X and Y address are both equal to 0, thus the transformation Table A indicates that this address is located in Quadrant III. Since the present invention reduces the required memory space, the address in Quadrant III and the data stored therein must be transformed to an address and data word in Quadrant I.

According to the transformation Table A the reflected address is the complement of the original address located in Quadrant III. Specifically, the original address had the value X2:X0=100 and Y2:Y0=111. The reflected address $X2^1:X0^1 = \overline{X2:X0} = 011$ and $Y2^1:Y0^1 = \overline{Y2:Y0} = 000$. Since the new address is located in Quadrant I, X3=1 and Y3=1, thus the new addresses are given by $X^1 = 1011$ and $Y^1 = 1000$. The transformed address is $X^1 = 11$ and $Y^1 = 8$. At this address, the data word stored, $d^1$, has the value 0. According to the transformation Table A, the true interpolation value of the data, d, stored at the original address in Quadrant III is $8 + d^1$ or 8. Since the memory Z is illustrated with 256 storage units in order to explain the present invention, the correct data is illustrated in Quadrant III under the original address. As already mentioned, it must be understood that the present invention does not make use of a memory having 256 storage units but these are merely illustrated to help explain the present invention.

A second example is illustrated in a step-by-step representation.

1) original address:
   $X=2$: $X3=0$ $X2=0$ $X1=1$ $X0=0$
   $Y=13$: $Y3=1$ $Y2=1$ $Y1=0$ $Y0=1$
   $d=?$
2) original address is located in Quadrant II:
3) transformed values obtained from Table A:
   $X2^1:X0^1 \to \overline{X2}=1$ $X1=0$ $X0=1$
   $Y2^1:Y0^1 \to \overline{Y2}=1$ $Y1=0$ $Y0=1$
4) data located at transformed address:
   $d^1=1$
5) correct data, d, stored at the original address
   $d=7-d^1=6$ Thus, at the original address $X=2$ and $Y=13$, the correct interpolation value is 6.

The transformation of the Quadrants II-IV into Quadrant I has only reduced the memory Z to one fourth its original size. Further transformations must be performed in order to reduce memory Z so that it can be implemented by VLSI technology.

A 45° line divides Quadrant I into two octants. Clockwise from the 45° line is the first octant and counterclockwise from the 45° line is the second octant. The second octant will be reflected or transformed into the first octant by a method similar to that described by Table A. Table B will illustrate how this transformation is accomplished.

TABLE B

| S | Octant | $X2^2:X0^2$ | $Y2^2:Y0^2$ | $d^1$ |
|---|---|---|---|---|
| >0 | 1 | $X2^1:X0^1$ | $Y2^1:Y0^1$ | $d^2$ |
| =0 | 45° line | | | |
| <0 | 2 | $Y2^1:Y0^1$ | $X2^1:X0^1$ | $3-d^2$ | where:
$S = (X^1 - Y^1)$
$X2^2:X0^2$ ⎫ represents the octant reflected addresses
$Y2^2:Y0^2$ ⎬ represents the octant reflected storage
$d^2$ ⎭ value
$X2^1:X0^1$ ⎫ addresses and storage content obtained
$Y2^1:Y0^1$ ⎬ from Table A
$d^1$ ⎭

The difference is taken between the reflected address $X^1$ and $Y^1$ in order to determine in which octant the address lies.

In the following example, a transformation of an address and interpolation value that lie in Quadrant IV to the first octant of Quadrant I will be illustrated using transformation Tables A and B.

A. Reflection into Quadrant I
1) original address:
   $X=11$, $Y=2$
2) binary representation
   $X3=1$ $X2=0$ $X1=1$ $X0=1$
   $Y3=0$ $Y2=0$ $Y2=1$ $Y0=0$
3) Quadrant determination
   $X3=1$ $Y3=0$, Quadrant IV
4) reflected address $X2^1:X0^1$, $Y2^1:Y0^1$
   $X2^1:X0^1 = X2:X0 = 011$
   $Y2^1:Y0^1 = \overline{X2:X0} = 101$
5) Quadrant reflected address
   $X^1=11$
   $Y^1=13$
6) reflected storage content
   $d^1=2$
7) original storage content
   $d=15-d^1=13$ B. Reflection into First Octant
8) octant determination
   $S = X^1 - Y^1 = 11 - 13 = -2$
   second octant
9) reflected address $X2^2:X0^2$, $Y2^2:Y0^2$
   $X2^2:X0^2 = Y2^1:Y0^1 = 010$
   $Y2^2:Y0^2 = X2^1:X0^1 = 011$
10) octant reflected address
    $X^2=13$, $Y^2=11$
11) octant storage content
    $d^2=1$
12) reflected storage content
    $d^1=3-d^2=2$ If the address lies directly on the 45° line, however, then new storage content can be given by either $d^2$ or $3-d^2$. This creates a so called quantification error which results in no specific disadvantage to the present invention but always occurs when using digital technique in limit zones.

At this point the memory Z has been reduced from 256 to 36 storage units. In addition, the address space is reduced to $2 \times 3$ bits for each coordinate. In order, however, to make possible a space-saving integration in VLSI switching circuit, the first octant containing 36 storage units must be reduced to the rectangular region of 32 storage units illustrated by the heavy bordered rectangle located in Quadrant I.

The next step in reducing the memory Z from 36 to 32 storage units is to transform each of the four storage units lying on the 45° straight line outside of the rectangular region shown in Quadrant I to a new address. This is accomplished by decrementing either the X or Y address by one.

There are three alternative ways of transforming these four units illustrated in Table C. The first alternative is given in line 2 of Table C. For all of the addresses lying on the 45° line outside of the rectangular region, the X address is decreased by one and the Y address remains the same. This has the effect of moving all of those addresses to the left of the 45° line and into the second octant. The data words remain the same. The third line illustrates the second alternative which is similar to the first except that all of the Y addresses are decreased by one and the X addresses remain the same. Line 4 and 5 illustrate the third alternative. In this case the odd Y addresses and the even X addresses have been decremented alternatively. For example, when the address is $X^2=15$, $Y^2=15$ the new address becomes $X^3=15$, $Y^3=14$. At the new address, the interpolation value $d^3$ is the same as the interpolation value $d^2$ at the original address. When the address is $X^2=12$, $Y^2=12$ the storage value $d^2$ is 2. Decrementing the X address by one produces the new address $X=11$, $Y=12$ with the same value in the storage unit $d^3$.

Table C describes the above transformation process.

TABLE C

| $X2^2 = Y2^2 = 1$ | $X2^3:X0^3$ | $Y2^3:Y0^3$ | $d^2$ |
|---|---|---|---|
| $X0^2 \neq Y0^2$ | $(X2^2:X0^2)-1$ | $Y2^2:Y0^2$ | $d^3$ |
| $X0^2 \neq Y0^2$ | $X2^2:X0^2$ | $(Y2^2:Y0^2)-1$ | $d^3$ |
| $X0^2 = Y0^2 = 0$ | $(X2^2:X0^2)-1$ | $Y2^2:Y0^2$ | $d^3$ |
| $X0^2 = Y0^2 = 1$ | $X2^2:X0^2$ | $(Y2^2:Y0^2)-1$ | $d^3$ |

$X2^3:X0^3$ ⎫ represents the transformed address
$Y2^3:Y0^3$ ⎬
$d^2 = d^3$ ⎭ storage unit value remains the same.

It will be noted that when the above transformation is conducted, transformations using the first alternative and the third alternative have moved addresses into the second octant. These will have to be reflected back into the first octant according to Table B. After the transformation performed by Table C, the memory Z is reduced from 36 to 32 storage units.

The final step is to reflect the partial triangular region designated a Z1 in Quadrant 1 into the partial triangle region Z2 thus completing the rectangular region. To accomplish this, the transformation Table D is used.

TABLE D

| $Y2^3$ | $X2^4;XO^4$ | $Y1^4;YO^4$ | $d^3$ |
|---|---|---|---|
| 0 | $X2^3;XO^3$ | $Y1^3;YO^3$ | $d^4$ |
| 1 | $O;Y1^3;YO^3$ | $X1^3;XO^3$ | $d^4$ |

It must be pointed out that the transformations according to Tables C and D are not illustrated in FIGS. 2 or 3. In these last transformations, only the address locations are altered, not the contents of the storage units.

As a result of the present invention, a position measuring system can be implemented with VLSI technology since the memory requirements have been significantly reduced. A memory of 32 storage units and an address register of $2 \times 2$ bits can represent values that would conventionally require a memory of 256 storage units and an address register of $2 \times 4$ bits. From this reduced memory, the interpolation value for any address can be obtained.

FIG. 3 illustrates a memory Z3 divided into three (3) zones in accordance with the present invention. In addition to the interpolation values stored in the various storage units, information regarding the amplitude of the signals U1 and U2 is also stored.

As is well known in the art, a circle is formed by plotting the sum of equal amplitude cosine and sine waves at phase angles ranging from 0°-360°. The diameter of the circle is dependent upon the amplitude of the cosine and sine waves. Illustrated in FIG. 3 are three zones; the first zone located inside the smaller diameter circle, the second zone located in the annular region between the smaller and larger diameters, and the third zone Z1 located outside the larger diameter. The area inside the first zone represents signals with amplitudes not large enough to evaluate the scanning signals. The area in the third zone represents signals wherein the signals amplitudes are too large and the system is in "overdrive." The admissible range is the annular area comprising the second zone.

A comparison of the data words inside the admissible range in memory Z3 with the data words in memory Z of FIG. 2 illustrates that they are the same. The values inside the first and third zones however, differ from the values in FIG. 2.

In order to obtain the data words in the first and third zones, two higher value bits are added to the data word.

For example, if the address is $X=15$ and $Y=3$, the interpolation value according the memory Z of FIG. 2 is 14. The binary representation of 14 is 1110. In order to display that at this address the amplitude of the signal is too large (or small in other cases), two bits are added as follows:

| max bit | min bit | data word |
|---|---|---|

When the max bit is 1, then the address falls within the third zone and the amplitude is too large. If the min bit is 1, the address is within the first zone and the signal amplitudes are too small. Therefore, when the address is $X=15$, $Y=3$ the signal is in overdrive and the binary representation now becomes 101110 which is equal to "46." At the address $X=9$ and $Y=9$ the value in memory Z of FIG. 2 is 1, however, the signal is too weak and the new binary representation is 010001 or "17". Finally, if the address is within the admissible range, the max and min bits are both zero and the interpolation value is the same as it was in memory Z of FIG. 2. Signal information has thus been coupled with memory storage content. Memory Z3 has been illustrated in full but as previously disclosed with respect to memory Z in FIG. 2, this is only for purposes of clarifying the explanation of the present invention. Memory Z3 is reduced to 32 storage units according to the same transformation tables described with respect to FIG. 2 as shown by the heavy border rectangle in FIG. 3.

While this invention has been shown and described in connection with preferred embodiments, it is apparent that certain changes and modifications, in addition to those mentioned above, may be made from the basic features of the present invention. Accordingly, it is intended that the scope of the invention be defined by the following claims, including all equivalents.

I claim:

1. An apparatus for determining the position of a moving object comprising:
    means for detecting movement of said object and creating periodic analog signals in response thereto;
    a converter for converting said periodic analog signals to a first address range;
    a subdivision circuit having memory with addressable storage locations, said memory storing interpolation data wherein said memory has a second address range of addressable storage locations, said second address range addressing less than one quarter the storage capacity addressable by said first address range; and
    a manipulation circuit receiving signals from said converter and said subdivision circuit and manipulating: (1) the address in said first address range to transform said addresses to addresses in said second address range, said first address range being of expanded scope from said second address range and including sufficient addresses to store interpolation data for a periodic signal range; and (2) said interpolation data located in said addressable storage locations so that correct interpolation information is obtained for address locations of said first address range.

2. An apparatus according to claim 1 wherein said second address range addresses one eighth the storage capacity addressable by said first address range.

3. An apparatus according to claim 1 wherein said memory is integratable in a VLSI switching circuit.

4. An apparatus according to claim 1 wherein said subdivision circuit includes data indicating whether said signals are in error.

5. An apparatus according to claim 1 wherein said interpolation data is manipulated to obtain correct interpolation information by adding or subtracting constants to or from said interpolation data.

6. An interpolating position measuring system comprising:

a graduation plate attached to a rotatable shaft;

means for producing at least two phase displaced analog signals as said graduation plate rotates on said shaft;

a converter for converting said analog signals to digital signals wherein said converted signals represent first addresses having associated therewith an interpolation valve for each of said first addresses;

a memory having interpolation data stored in memory locations represented by second addresses, wherein said second addresses comprise a subset of said first addresses and each second address has a data word associated therewith wherein said data words can be transformed to represent all interpolation valves in said first addresses, said memory being less than one quarter the size of a memory necessary for a full interpolation of 360° of rotation of said shaft;

means for receiving signals from said converter and said memory means and transforming said first addresses to second addresses and said interpolation data in said second addresses to interpolation data for said first addresses.

7. A position measuring system according to claim 6 wherein said means for producing at least two analog phase displaced signals comprises a scanning unit for detecting said shaft's position comprising a light source and at least two photodetectors.

8. A position measuring system for determining a position of a moving object wherein phase displaced analog periodic signals are converted into digital signals including a memory in which interpolation data for particular combinations of said converted signals are pre-stored at respective addresses in a memory, said memory being less than one quarter the size of a memory necessary for a full interpolation of 360° and memory addressing means into which the converted signals are input so as to cause corresponding pre-stored results to be output from said memory, the improvement comprising:

said memory having an address range reduced in size to less than one quarter the size of a memory necessary to contain interpolation data for a signal period for said periodic signals; and means for transforming the addresses in said memory to addresses in said address range and for manipulating said interpolation data in said memory by addition of subtraction of constants to the interpolation data to obtain correct interpolation data for the signal period.

9. A position measuring system according to claim 8 wherein said memory is reduced from a 256 data storage unit to a 32 data storage unit and said memory addressing means is reduced from a coordinate system comprising of 2×4 bits each to a coordinate system represented by 2×2 and 2×3 bits.

* * * * *

UNITED STATES PATENT AND TRADEMARK OFFICE
CERTIFICATE OF CORRECTION

PATENT NO. : 5,216,626
DATED : June 1, 1993
INVENTOR(S) : Walter Kranitzky

Page 1 of 2

It is certified that error appears in the above-indentified patent and that said Letters Patent is hereby corrected as shown below:

In column 4, line 30, delete "MSG" and substitute --MSB--.

In column 5, line 14, delete "$\underline{X2}$", and substitute --X2--.

In column 5, line 65, please delete "X2:X0" and substitute --Y2:Y0--.

In column 7, line 9, please delete "a" and substitute --as--.

In column 7, line 60, please delete "the" and substitute --to--.

UNITED STATES PATENT AND TRADEMARK OFFICE
CERTIFICATE OF CORRECTION

PATENT NO. : 5,216,626
DATED : June 1, 1993
INVENTOR(S) : Walter Kranitzky

It is certified that error appears in the above-indentified patent and that said Letters Patent is hereby corrected as shown below:

Column 8, line 45, delete "address" (1st Occ.) and substitute --addresses--.

Column 9, line 8, delete "valve" and substitute --value--.

Column 9, claim 6, line 15, delete "valves" and substitute --values--.

Signed and Sealed this

Eleventh Day of July, 1995

Attest:

BRUCE LEHMAN

Attesting Officer

Commissioner of Patents and Trademarks